(12) United States Patent
Funabashi

(10) Patent No.: US 8,149,891 B2
(45) Date of Patent: Apr. 3, 2012

(54) SEMICONDUCTOR DEVICE AND OPTICAL MODULE

(75) Inventor: Masaki Funabashi, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 12/620,267

(22) Filed: Nov. 17, 2009

(65) Prior Publication Data

US 2010/0215072 A1   Aug. 26, 2010

Related U.S. Application Data

(63) Continuation of application No. 12/414,902, filed on Mar. 31, 2009, now abandoned.

(30) Foreign Application Priority Data

Mar. 31, 2008   (JP) ................................. 2008-092935

(51) Int. Cl.
   *H01S 5/00*   (2006.01)

(52) U.S. Cl. .................................. 372/50.12; 372/50.1

(58) Field of Classification Search ............... 372/50.12, 372/50.1; 385/14, 50; 257/432
   See application file for complete search history.

(56) References Cited

U.S. PATENT DOCUMENTS 7,561,765 B2   7/2009   Funabashi et al.

2002/0150320 A1*  10/2002  Kato ................................. 385/14
2003/0174926 A1*  9/2003  Oikawa et al. ................... 385/14
2010/0111468 A1   5/2010  Funabashi et al.

OTHER PUBLICATIONS

A. J. Collar et al, "Low Residual Reflectivity of Angled-Facet Semiconductor Laser Amplifiers," IEEE Photonics Technology Letters, vol. 2, No. 8, Aug. 1990, pp. 553-555.

* cited by examiner

*Primary Examiner* — Patrick Stafford
(74) *Attorney, Agent, or Firm* — Oblon, Spivak, McClelland, Maier & Neustadt, L.L.P.

(57) ABSTRACT

A semiconductor laser element 10 according to the present invention comprises a waveguide 12 of a high mesa type. And then such the waveguide 12 comprises an oblique end face 17 as an emitting facet that is different from a cleaved end face 16. And hence it becomes possible to reduce a reflection factor at the end face by making of such the oblique end face 17, and it becomes possible to design a direction of an emitting beam 21, that is to be emitting from the oblique end face 17, to be independent of that for the cleaved end face 16 as well. Moreover, the emitting beam 21 is designed to be emitting as vertical to the cleaved end face 16. And then therefore in a case where an emitting beam from a semiconductor optical device is designed to be coupled with such as an optical fiber or another waveguide or the like, it is not necessary to device such as that the semiconductor laser element 10 is required to be arranged at a sub mount by being inclined to be oblique or the like.

14 Claims, 9 Drawing Sheets

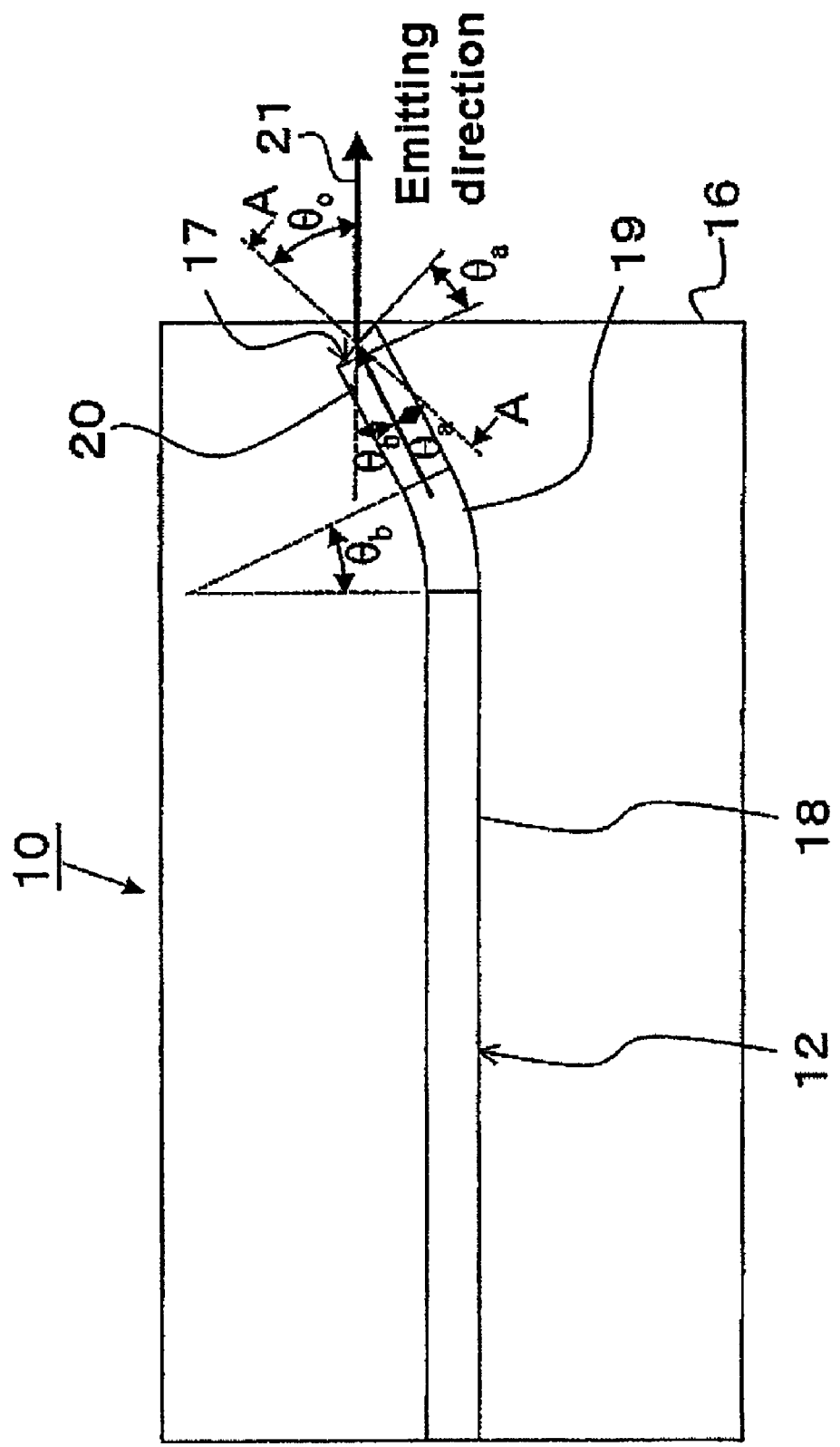

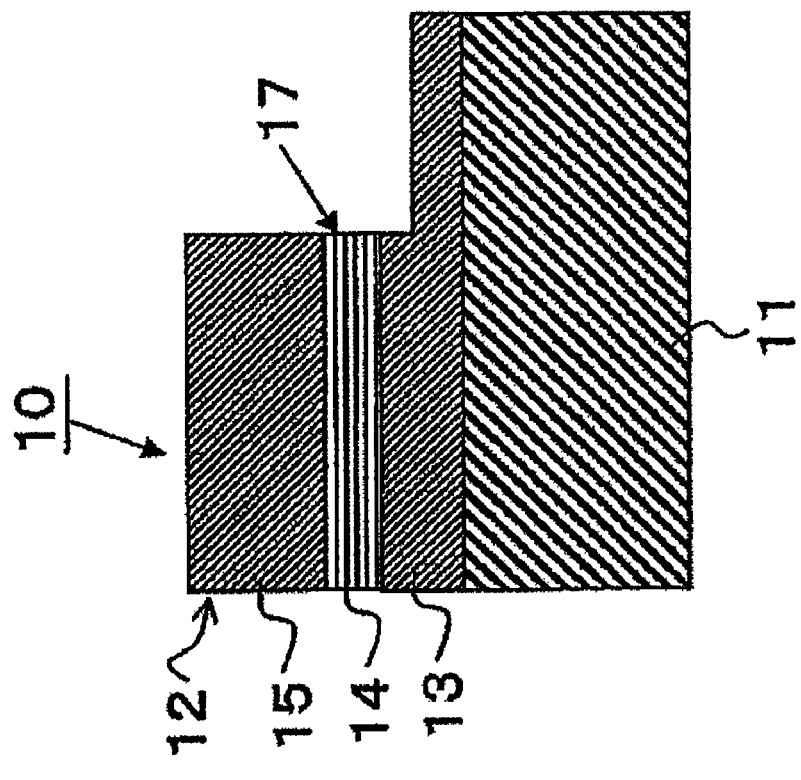
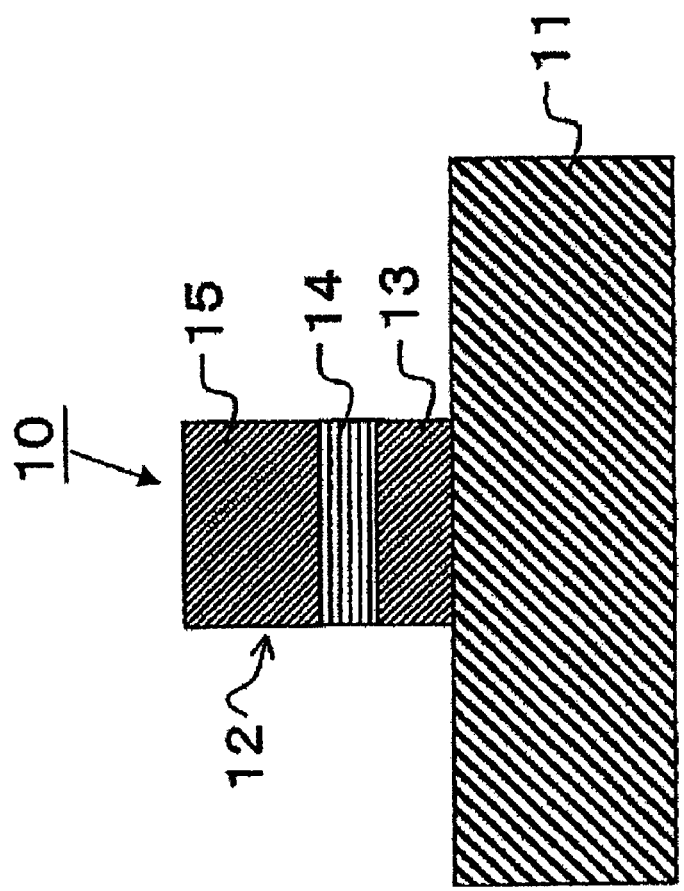

US 8,149,891 B2

SEMICONDUCTOR DEVICE AND OPTICAL MODULE

BACKGROUND OF THE INVENTION

1. Technical Field

The present invention relates to a semiconductor optical device and an optical module.

2. Related Arts

For a semiconductor optical device that is designed to be formed on a semiconductor substrate that is made from such as an indium phosphorus or a gallium arsenide or the like, for a semiconductor optical device of a type for receiving and emitting light at an end face in particular, such as an edge-emitting semiconductor laser device or a semiconductor optical amplifier of a waveguide type or a semiconductor photo detector of the waveguide type or the like, a cleaved end face is often made use as an incident facet and an emitting facet at each of such the devices by making use of a cleavability of such the substrate of each of the semiconductors. As typically, a reflection factor at such the end face on the waveguide is determined due to each index of refractions of a semiconductor and an external ambient atmosphere because such the waveguide is designed to be formed in a direction as vertical to the cleaved face. Here, the index of refraction of any semiconductor is assumed to be as approximately three in typical, and then the reflection factor at the cleaved end face is evaluated to be as thirty percent in a case where the external ambient atmosphere is assumed to be as an air that has the index of refraction to be as approximately one. And then therefore it may be available to make use of such the cleaved end face itself for a reflecting mirror. Or, it may be available to make use for a lower reflecting end face or for a higher reflecting end face as well by forming a coating film layer on to such the end face. Moreover, there is provided a method in which a direction of waveguide in a semiconductor optical device is designed to be shifted as intentionally from the direction as vertical to the cleaved end face as a method for reducing the reflection factor at the end face without making use of such the coating film layer, that is disclosed in the following Document 1. And then in accordance with such the method, a cleaved end face 102 is designed to be oblique to a waveguide 101 in a semiconductor optical device 100 that is shown in FIG. 9 (A). And then therefore it becomes possible to reduce an equivalent reflection factor because it becomes difficult for a reflected light to couple again with the waveguide 101 that is reflected at such the cleaved end face (obliquely cleaved end face). Further, there are some cases in which it is desirable to suppress such the reflection factor at the end face as much as possible with depending on a usage of a semiconductor optical device. And then there are a lot of cases in which such a reflection free coating film layer and such the method of the obliquely cleaved end face are made use together. Furthermore, a emitting beam 103 from the waveguide 101 is not designed to be output as vertical to such the cleaved end face 102 but is designed to be output to a direction that is inclined as obliquely thereto in the case where such the obliquely cleaved end face 102 is designed to be made use therefore, that is shown in FIG. 9 (A). And then in a case where the external ambient atmosphere is assumed to be the air, such the emitting beam 103 with having an angle for output to be inclined as approximately three times as an angle of the waveguide 101 against the cleaved end face 102 due to a phenomenon of the refraction that is caused due to the difference on the indexes of refraction of between such the semiconductor and the air.

[Document 1] A. J. Collar et al., "Low residual reflectivity of angled-facet semiconductor laser amplifiers," IEEE Photonics Technology Letters, volume 2, Issue 8, pp. 553-555, 1990.

In the meantime, however, in a case where the emitting beam 103 from the semiconductor optical device 100 that is disclosed in such as the above mentioned Document 1 is designed to be coupled with such as an optical fiber 104 or another waveguide or the like, that is shown in FIG. 9 (B), it is necessary to devise such as that such the semiconductor optical device 100 is required to be arranged at a sub mount 105 by being inclined to be oblique beforehand or the like. And then it becomes necessary to make use of special bonding equipment in order to perform such the arrangement of the semiconductor optical device 100 on to the sub mount 105 with inclining to be oblique as accurately so as to obtain an angle in accordance with a designing. Or, it becomes necessary to devise on a process of working, such as that a marker for an angle is designed to be introduced into such the sub mount 105 or the like. Moreover, there are some problems of such as that it is difficult to obtain an accuracy regarding a relative positioning of between an emitting facet 101a of the waveguide 101 and an end face on the sub mount 105.

Further, there are other problems in accordance with an array of semiconductor optical devices 110 in which semiconductor optical devices are designed to be arranged in an array form that it is not possible to maintain a gap as uniformly for between each of the semiconductor optical devices in such the array of the semiconductor optical devices 110 and optical part or component because it cannot help but being occurred an interference between the sub mount 105 and the optical part or component (a front part of an array of optical fibers 120 that is shown in FIG. 9 (C)), such as an optical fiber or a waveguide or a lens or the like, due to an occurrence of a shift as gradually with depending on each of such the semiconductor optical devices regarding a positioning of each of emitting facets 110a on the array of the semiconductor optical devices 110 against a line on the sub mount 105, that are shown in FIG. 9 (C). Or, in order to maintain such the gap to be as uniformly, it is excessively difficult to perform a production of an optical module because of such as becoming necessary to make use of special optical part and component, such as an array of optical fibers in which a positioning of each of ends is designed to be shifted gradually or the like.

BRIEF SUMMARY OF THE INVENTION

And therefore the present invention is provided with having regard to such the conventional problems, and an objective of the present invention is to provide a semiconductor optical device and an optical module individually in which it becomes possible for a direction of an incident beam into a waveguide in such the semiconductor optical device or for a direction of an emitting beam from such the waveguide to be designed as independently from a designing for a cleaved end face, with obtaining an advantage of reducing a reflection factor at an end face as well by making use of an oblique end face on such the waveguide.

In order to solve the subjects that are described above, a semiconductor optical device according to the present invention is characterized in that such the semiconductor optical device comprises: a semiconductor substrate; and a waveguide that is formed on the semiconductor substrate, wherein the waveguide comprises another end facet as an incident facet or as an emitting facet except a cleaved end face, and the other end facet is designed to be as an oblique end face that is facing to a direction as different from that for the cleaved end face.

And then in accordance with such the configuration, it becomes possible to design a direction of an incident beam into the oblique end face or to design a direction of an emitting beam from such the oblique end face as independently from a designing for a cleaved end face, with being possible to reduce a reflection factor at the end face as well by making use of such the oblique end face. And then therefore it becomes possible to obtain a semiconductor optical device in which it becomes possible for the direction of the incident beam into the waveguide in such the semiconductor optical device or for the direction of the emitting beam from such the waveguide to be designed as independently from the designing for the cleaved end face, with obtaining the advantage of reducing the reflection factor at the end face as well by making use of such the oblique end face on such the wave guide.

Here, the naming of such the semiconductor optical device is made use for a meaning that includes an edge-emitting semiconductor laser and a semiconductor photo detector of a waveguide type and a semiconductor waveguide device, such as a semiconductor optical amplifier (SOA) and a modulator of an electro-absorption (EA) type and a modulator of a Mach-Zehnder (MZ) type and the like.

The semiconductor optical device according to the present invention is characterized in that regarding such the semiconductor optical device according to claim 1 the waveguide is designed to be as a waveguide in a semiconductor laser element, the emitting facet on the waveguide is designed to be as different from the cleaved end face and is designed to be as the oblique end face that is facing to the direction as different from that for the cleaved end face, and a direction of a beam that is to be emitting from the oblique end face is designed to be as vertical to the cleaved end face.

And then in accordance with such the configuration, in a case where the emitting beam from the semiconductor optical device is designed to be coupled with such as an optical fiber or another waveguide or the like it is not necessary to devise such as that a semiconductor optical device is required to be arranged at a sub mount by being inclined to be oblique beforehand or the like in accordance with the conventional technique for example that is mentioned above, because the direction of the emitting beam from the oblique end face is designed to be as vertical to the cleaved end face. Moreover, it is not necessary to make use of any special bonding equipment in order to perform such the arrangement of the semiconductor optical device on to the sub mount with inclining to be oblique as accurately so as to obtain the angle in accordance with the designing on the contrary to that in accordance with the conventional technique which is mentioned above. Further, it is not necessary to devise on the process of working either, such as that the marker for the angle is designed to be introduced into such the sub mount or the like. And then therefore it becomes easier to obtain the accuracy regarding the relative positioning of between the oblique end face that is the emitting facet from the waveguide in such the semiconductor optical device and the end face on such the sub mount.

The semiconductor optical device according to the present invention is characterized in that regarding such the semiconductor optical device, a plurality of the waveguides are provided in an array form on to the semiconductor substrate to be configured as an array of the semiconductor laser elements.

And then in accordance with such the configuration, it becomes possible to obtain a distance (gap) to be as uniformly for between the oblique end face on each of the waveguides that is designed to be provided as a plurality thereof in the array form (each of the emitting facet) and the cleaved end face. And hence it is not necessary to make use of any special optical part nor component nor any additional process of working in order to maintain the above mentioned gap to be as uniformly in accordance with the conventional technique for example that is mentioned above in a case where such the emitting facet from each of such the waveguides in the array of the semiconductor laser elements is designed to be coupled with such as an array of optical fibers or a plurality of optical guided wave paths in a planer lightwave circuit or the like.

The semiconductor optical device according to the present invention is characterized in that a spot-size converter is integrated at an output part of said waveguide, and an emitting facet on each of the spot-size converter is designed to be as said oblique end face.

And then in accordance with such the configuration, the spot-size converter is integrated at the emitting part from such the waveguide, and then the emitting facet on the spot-size converter is designed to be as the oblique end face as well. And then therefore it becomes possible to improve an efficiency of coupling for between the emitting beam from such the oblique end face on the waveguide and an optical part or component of such as an optical guided wave path in an planer lightwave circuit or the optical fiber or the like, regarding the semiconductor laser element and the array of the semiconductor laser elements.

The semiconductor optical device according to the present invention is characterized in that regarding such the semiconductor optical device, the waveguide is designed to be as a waveguide in a semiconductor photo detector of a waveguide type, the incident facet on the waveguide is designed to be as different from the cleaved end face and is designed to be as the oblique end face that is facing to the direction as different from that for the cleaved end face, and a direction of an incident beam into said oblique end face is designed to be as vertical to said oblique end face.

And then in accordance with such the configuration, in a case where the incident beam into the semiconductor photo detector is designed to be coupled with such as an optical fiber or another waveguide or the like it is not necessary to device such as that a semiconductor photo detector is required to be arranged at a sub mount by being inclined to be oblique beforehand or the like in accordance with the conventional technique for example that is mentioned above, because the direction of the incident beam into the oblique end face is designed to be as vertical to the cleaved end face. Moreover, it is not necessary to make use of any special bonding equipment in order to perform such the arrangement of the semiconductor photo detector on to the sub mount with inclining to be oblique as accurately so as to obtain the angle in accordance with the designing by making use of the conventional technique that is mentioned above. Further, it is not necessary to devise on the process of working either, such as that the marker for the angle is designed to be introduced into such the sub mount or the like. And then therefore it becomes easier to obtain the accuracy regarding the relative positioning of between the oblique end face that is the incident facet into the waveguide in such the semiconductor photo detector and the end face on such the sub mount.

The semiconductor optical device according to the present invention is characterized in that regarding such the semiconductor optical device, a plurality of the waveguides are provided in an array form on to the semiconductor substrate to be configured as an array of the semiconductor photo detectors.

And then in accordance with such the configuration, it becomes possible to obtain a distance (gap) to be as uniformly for between the oblique end face on each of the waveguides that is designed to be provided as a plurality thereof in the array form (each of the incident facet) and the cleaved end face. And hence it is not necessary to make use of any special optical part nor component nor any additional process of working in order to maintain the above mentioned gap to be as uniformly in accordance with the conventional technique for example that is mentioned above in a case where the incident facet into each of such the waveguides in the array of the semiconductor photo detectors is designed to be coupled with such as the array of the optical fibers or a plurality of the optical guided wave path in the planer lightwave circuit or the like.

The semiconductor optical device according to the present invention is characterized in that regarding such the semiconductor optical device, a spot-size converter is integrated at an input part of the waveguide, and an incident facet on the spot-size converter is designed to be as the oblique end face.

And then in accordance with such the configuration, the spot-size converter is integrated at the incident part into such the waveguide, and then the incident facet on the spot-size converter is designed to be as the oblique end face as well. And then therefore it becomes possible to improve an efficiency of coupling for between the incident beam into such the oblique end face on the waveguide and the optical part or component of such as the optical guided wave path in the planer lightwave circuit or the optical fiber or the like, regarding the semiconductor photo detector and the array of the semiconductor photo detectors.

The semiconductor optical device according to the present invention is characterized in that regarding such the semiconductor optical device, the waveguide is designed to be as a waveguide in a semiconductor waveguide device that influences an optical effect or an electro-optical effect as desired to an incident light, the incident facet and the emitting facet on the waveguide are designed to be individually as different from the cleaved end face and are designed to be individually as the oblique end faces that are individually facing to directions as different from that for the cleaved end face respectively, and a direction of an incident beam into the oblique end face as the incident facet is designed to be as vertical to the cleaved end face, and a direction of an emitting beam from the oblique end face as the emitting facet is designed to be as vertical to the cleaved end face as well.

And then in accordance with such the configuration, it becomes easier to obtain the accuracy regarding the relative positioning of the incident facet into the waveguide in such the semiconductor waveguide device and of the emitting facet therefrom against the end face on such the sub mount. Here, the naming of such the semiconductor waveguide device is made use for a meaning that includes such as the semiconductor optical amplifier (SOA) and the modulator of the electro-absorption (EA) type and the modulator of the Mach-Zehnder (MZ) type and the like.

The semiconductor optical device according to the present invention is characterized in that regarding such the semiconductor optical device, a plurality of the waveguides are provided in an array form on to the semiconductor substrate to be configured as an array of the semiconductor waveguide devices.

And then in accordance with such the configuration, it becomes possible to obtain a distance (gap) to be as uniformly for between the oblique end face on each of the waveguides that is designed to be provided as a plurality thereof in the array form (each of the emitting facet) and the cleaved end face. And hence it is not necessary to make use of any special optical part nor component nor any additional process of working in order to maintain the above mentioned gap to be as uniformly in accordance with the conventional technique for example that is mentioned above in a case where the incident facet into each of such the waveguides and the emitting facet therefrom in an array of the semiconductor optical amplifiers or in an array of the modulator of the electro-absorption type or in an array of the modulator of the Mach-Zehnder type are individually designed to be coupled with such as the array of the optical fibers or a plurality of the optical guided wave path in the planer lightwave circuit or the like.

The semiconductor optical device according to the present invention is characterized in that regarding such the semiconductor optical device, spot-size converters are integrated at an input part into the waveguide and at an output part therefrom, and an incident facet on each of the spot-size converters that are integrated at the input part is designed to be as the oblique end face, and an emitting facet on each of the spot-size converters that are integrated at the output part is designed to be as the oblique end face as well.

And then in accordance with such the configuration, it becomes possible to improve an efficiency of coupling for between the incident beam into such the oblique end face that is designed to be as the incident facet into the waveguide and the optical part or component of such as the optical guided wave path in the planer lightwave circuit or the optical fiber or the like, and it becomes possible to improve an efficiency of coupling as well for between the emitting beam from such the oblique end face that is designed to be as the emitting facet from the waveguide and such the optical part or component that is mentioned above, regarding the semiconductor waveguide device and the array of such the semiconductor waveguide devices, such as the semiconductor optical amplifier or the modulator of the electro-absorption type or the modulator of the Mach-Zehnder type or the like.

An optical module according to the present invention is characterized in that such the optical module comprises: the semiconductor optical device, the incident beam into the waveguide or the emitting beam from the waveguide is designed to be coupled with an optical fiber or an array of the optical fibers via an optical part and/or component.

And then in accordance with such the configuration, it becomes possible to obtain the optical module in which it becomes possible for a direction of the incident beam into the waveguide in such the semiconductor optical device and for a direction of the emitting beam from such the waveguide to be designed as independently from the designing for the cleaved end face, with obtaining the advantage of reducing the reflection factor at the end face as well by making use of such the oblique end face on such the waveguide.

An optical module according to the present invention is characterized in that such the optical module comprises: the semiconductor optical device, an end face of the semiconductor substrate is designed to be faced with an end face of a chip of a planer lightwave circuit to each other in which the planer lightwave circuit including an optical guided wave path is designed to be formed, and the incident beam into the waveguide or the emitting beam from the waveguide is designed to be performed an optical coupling with the optical guided wave path of the chip of the planer lightwave circuit.

And then in accordance with such the configuration, it becomes possible to obtain the optical module in which it becomes possible for a direction of the incident beam into the waveguide in such the semiconductor optical device and for a direction of the emitting beam from such the waveguide to be designed as independently from the designing for the cleaved end face, with obtaining the advantage of reducing the reflection factor at the end face as well by making use of such the oblique end face on such the waveguide.

An optical module according to the present invention is characterized in that such the optical module comprises: the semiconductor optical device, an end face of the semiconductor substrate is designed to be faced with an optical fiber or an array of the optical fibers to each other, and the incident beam into the waveguide or the emitting beam from the waveguide is designed to be performed an optical coupling with the optical fiber or the array of the optical fibers.

And then in accordance with such the configuration, it becomes possible to obtain the optical module in which it becomes possible for a direction of the incident beam into the waveguide in such the semiconductor optical device and for a direction of the emitting beam from such the waveguide that is to be designed as independently from the designing for the cleaved end face, with obtaining the advantage of reducing the reflection factor at the end face as well by making use of such the oblique end face on such the waveguide.

EFFECTS OF THE INVENTION

In accordance with the present invention, it becomes possible to realize the semiconductor optical device in which it becomes possible for the direction of the incident beam into the wave guide in such the semiconductor optical device and for the direction of the emitting beam from such the waveguide to be designed as independently from the designing for the cleaved end face, with obtaining the advantage of reducing the reflection factor at the end face as well by making use of such the oblique end face on such the waveguide.

Moreover, in accordance with the present invention, it becomes possible to realize the optical module in which it becomes possible for the direction of the incident beam into the waveguide in such the semiconductor optical device and for the direction of the emitting beam from such the waveguide to be designed as independently from the designing for the cleaved end face, with obtaining the advantage of reducing the reflection factor at the end face as well by making use of such the oblique end face on such the waveguide.

BRIEF DESCRIPTION OF THE DRAWINGS

The above and other objects and features of the invention will appear more fully hereinafter from a consideration of the following description taken into connection with the accompanying drawing wherein one example is illustrated by way of example, in which;

FIG. 1 is a plan view showing a schematic configuration of a semiconductor laser element in accordance with the first embodiment.

FIG. 2 (A) is a cross sectional view showing a schematic configuration of the semiconductor laser element that is shown in FIG. 1; and FIG. 2 (B) is a cross sectional view along a line of A-A' in a vicinity of an oblique end face on the semiconductor laser element that is shown in FIG. 1.

FIG. 4 (B) is a cross sectional view along a line of B-B' in a vicinity of an oblique end face on the semiconductor laser element that is shown in FIG. 3.

DETAILED DESCRIPTION OF THE INVENTION

Figure 3:
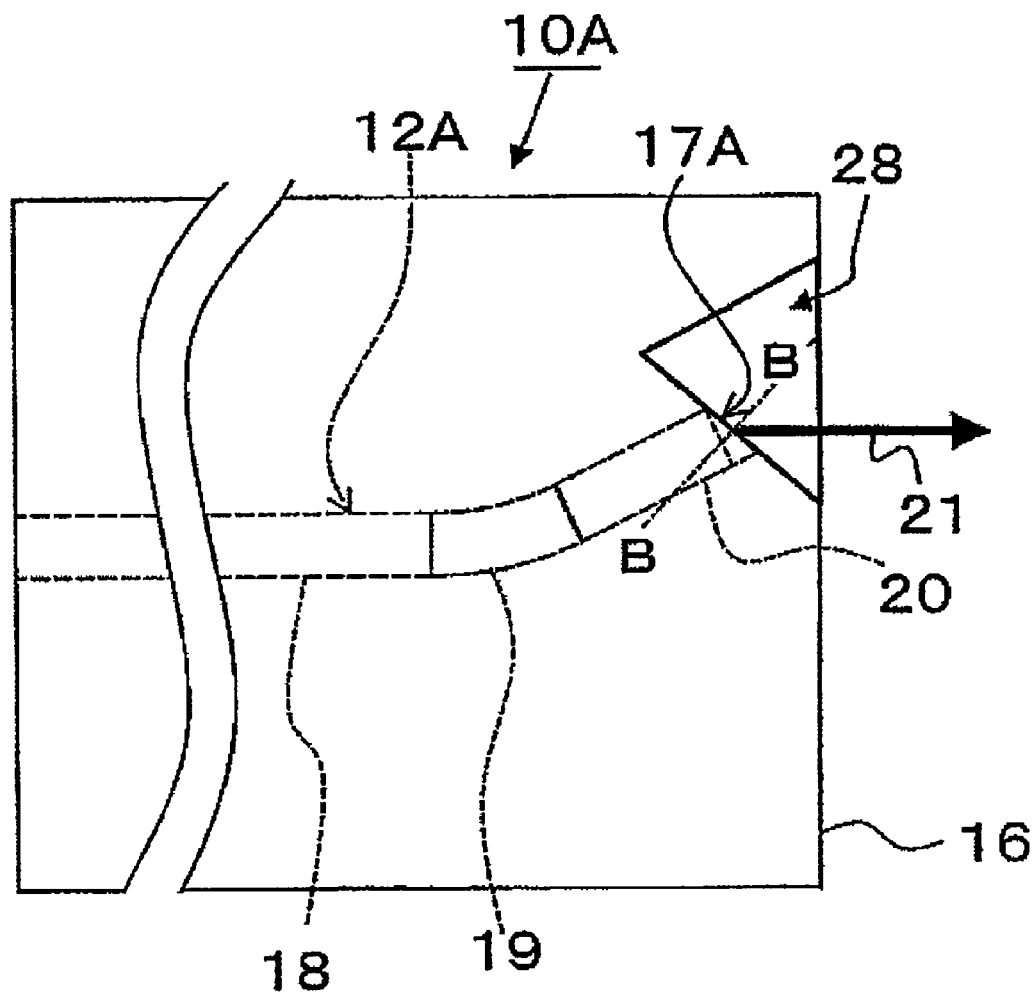
FIG. 3 is a plan view showing a schematic configuration of a semiconductor laser element in accordance with the second embodiment.

Hereinafter each of embodiments in accordance with the present invention will be described in detail below.

Each of the embodiments by which the present invention is embodied will be described in detail below in reference to each of the drawings respectively. Moreover, regarding a description in each of the embodiments a part that is similar to each other is designated by making use of the similar symbol, and then a duplicated description will be omitted.

The First Embodiment

An edge-emitting semiconductor laser element 10 (laser diode; an LD) that is designed to be as a semiconductor optical device regarding the first embodiment in accordance with the present invention will be described in detail below, in reference to FIG. 1, FIG. 2 (A) and FIG. 2 (B). Here, FIG. 1 is a plan view for showing the semiconductor laser element 10; FIG. 2 (A) is a cross sectional view for showing a schematic configuration of such the semiconductor laser element 10; and FIG. 2 (B) is a cross sectional view along a line of A-A' in a vicinity of an oblique end face on such the semiconductor laser element 10 that is shown in FIG. 1.

And then such the semiconductor laser element 10 comprises a substrate of an InP 11 and a waveguide 12 of a high mesa type that is designed to be formed on to such the substrate of the InP 11, that are shown in FIG. 2 (A). Moreover, it may be available to make use of a substrate of such as a GaAs or the like in place of such the substrate of the InP 11.

Further, such the waveguide 12 comprises: a cladding layer at a lower side 13 as an (n) type that is formed of an InP and that is formed on the substrate of the InP 11; an active layer 14 that is formed of an InGaAsP and that is formed on such the cladding layer at the lower side 13; and a cladding layer at an upper side 15 as a (p) type that is formed of an InP and that is formed on such the active layer 14. Still further, such the active layer 14 is designed to be as an active layer of MQW-SCH that has a multiple quantum well (MQW) structure and has a separated confined hetero (SCH) structure as well.

Furthermore, such the semiconductor laser element 10 further comprises: a contact layer of a (p) type that is formed of an InGaAs and that is formed on such the cladding layer at the upper side 15; an electrode at a (p) side that is formed on an upper surface of such the contact layer; and an electrode at an (n) side that is formed at a side of a rear surface of the substrate of the InP 11, though that are individually omitted to be shown in any of the drawings respectively.

And then some aspects in accordance with such the semiconductor laser element 10 can be found out in the configuration that will be described in detail below.

A: The waveguide 12 of the high mesa type comprises another end face than a cleaved end face 16, that is to say, an end face 17 as an emitting facet which is different from such the cleaved end face 16, that is shown in FIG. 1.

B: Such the end face 17 is designed to be facing to a direction as different from that of the cleaved end face 16, that is to say, such the end face 17 is designed to be inclined as oblique against such the cleaved end face 16. And then such the end face as the emitting facet is referred to as an oblique end face 17 in the following description.

C: the waveguide 12 further comprise: a linear waveguide 18; a bended waveguide 19; and an emitting waveguide 20, in which an end face on such the emitting waveguide 20 is designed to be as such the oblique end face 17, that are shown in FIG. 1.

Next, a process of manufacturing such the semiconductor laser element 10 as the semiconductor optical device that comprises such the above mentioned configuration will be described as briefly below.

In the first instance, the following crystal growth is designed to be performed on to the substrate of the InP 11 at a temperature for the growth of approximately 600° C. by making use of an equipment of a metal organic chemical vapor deposition (MOCVD) for the crystal growth.

Here on to the substrate of the InP as the (n) type 11 (the n-InP substrate) there are designed to be performed the following processes of crystal growth of the cladding layer at the lower side 13 of the InP as the (n) type (the n-InP cladding layer at the lower side), the active layer 14 of the MQW-SCH that is formed of the InGaAsP, the cladding layer at the upper side 15 of the InP as the (p) type (the p-InP cladding layer at the upper side) and then the contact layer of the InGaAs as the (p) type which is omitted to be shown in any of the drawings as one after the other in such the order, that are shown in FIG. 2 (A).

Next, a film layer of an $SiN_X$ is designed to be performed a process of accumulating on to such the substance by making use of an equipment for processing a plasma chemical vapour deposition (PCVD), and then there is performed a process of patterning of a waveguide to be as a striped shape that is comprised of the linear waveguide 18 and the bended waveguide 19 and the emitting waveguide 20 as well in which the oblique end face 17 is designed to be provided, that are shown in FIG. 1. Moreover, a width of such the waveguide is designed to be formed as approximately two micrometers.

And then thereafter the waveguide 12 of the high mesa type is designed to be formed by performing a process of dry etching with making use of such the patterning of the waveguide to be as a mask that is formed of the film layer of the $SiN_X$. Moreover, the oblique end face 17 that is designed to be as the emitting facet from the waveguide 12 is designed to be performed a process of forming at a same time when such the waveguide 12 as the high mesa type is designed to be performed a process of forming in accordance with such the process of dry etching. And then in order to perform the process of forming such the oblique end face 17 there is designed to be performed a process of etching to be penetrated through the p-InP cladding layer at the upper side 15 and also through the active layer 14 till a depth reaching to a part at an upper side of the n-InP cladding layer at the lower side 13 in accordance with such the process of dry etching, that are shown in FIG. 2 (B).

And thus in accordance with such the process of etching it becomes possible to form the waveguide 12 of the high mesa type that is shown in FIG. 1, FIG. 2 (A) and in FIG. 2 (B). Further, such the waveguide 12 becomes possible to comprise the oblique end face 17 that is designed to be as the end face which is different from the cleave end face 16 and that is designed to be inclined as oblique against such the cleave end face 16.

Still further, it becomes possible to perform the process of forming the waveguide 12 of the high mesa type which has a perpendicularity as higher by making use of such the process of dry etching, that is shown in FIG. 2 (A) and in FIG. 2 (B). Furthermore, it becomes possible to perform not only the process of forming the waveguide pattern of such the waveguide 12 but also a process of forming the oblique end face 17 that is designed to be as the emitting facet from the waveguide 12 at the same time in accordance with such the process of dry etching.

And then after performing such the process of dry etching the mask that is formed of the $SiN_X$ is designed to be performed a process of removing therefrom. And then thereafter a passivation film layer of an $SiN_X$ is designed to be performed a process of accumulating on to all over the top surface of the substrate of the InP 11 by making use of the equipment for processing the PCVD, that are omitted to be shown in any of the drawings. Moreover, the film layer of the $SiN_X$ only at an upper side of the waveguide 12 is performed a process of removing therefrom, and then thereafter an electrode at a (p) side is performed a process of evaporating that is omitted to be shown in any of the drawings. Further, the rear surface of such the substrate of the InP 11 is designed to be performed a process of polishing, and then thereafter an electrode at an (n) side is designed to be performed a process of forming on to such the rear surface of the substrate of the InP 11, that is omitted to be shown in any of the drawings.

Next, a designing of the pattern of such the waveguide 12 will be described in detail below. Here such the waveguide 12 in accordance with the present embodiment is designed to be comprised of the emitting waveguide 20 in which the oblique end face 17 is designed to be provided, and the bended waveguide 19 and the linear waveguide 18. And then such the oblique end face 17 that is the emitting facet from such the emitting waveguide 20 is designed to be as the end face to be inclined as oblique with having an angle as $\theta_a$ against the direction as vertical to such the emitting waveguide 20. And then due to such the oblique end face 17 the reflection factor becomes to be reduced at such the end face on such the waveguide with comparing to a case where the end face on such the emitting waveguide 20 is designed to be an end face as vertical thereto. Moreover, it may be good to determine such the angle as $\theta_a$ of such the oblique end face 17 so as to obtain the effect of reducing such the reflection factor at the end face be as the maximum. Here in accordance with the present embodiment it is assumed that such the $\theta_a$ is equal to seven degrees. And then an emitting beam 21 that is to be outgoing from the emitting waveguide 20 in which such the oblique end face 17 is designed to be provided (refer to FIG. 1) becomes to be outgoing with having a predetermined angle against a direction as extended from such the emitting waveguide 20. And then therefore it becomes possible to be proven true regarding the following equation between the angle of incident radiation as $\theta_a$ into the oblique end face 17 and an angle which is formed by a normal line of the oblique end face 17 and an outgoing direction of the emitting beam 21 that is assumed here to be as $\theta_c$.

$$n_s \sin \theta_a = n_a \sin \theta_c \qquad (1).$$

Here, the $n_s$ is defined to be as an effective index of refraction of the waveguide 12 that is designed to be as the semiconductor wave guide, and the $n_a$ is defined to be as an index of refraction of an external ambient atmosphere. And then in accordance with the present embodiment it is assumed that the $n_s$ is equal to 3.2 and the $n_a$ is equal to one, it becomes possible to obtain that the $\theta_c$ is nearly equal to twenty-three degrees.

In the meantime, however, in the case as normal where the oblique end face 17 on the emitting waveguide 20 is designed to be a face as similar to the cleaved end face 16 the outgoing direction of the emitting beam 21 becomes to be inclined with having the angle as $\theta_c$ against the direction of the normal line of such the oblique end face 17 such as in the calculation that is expressed above. On the contrary in accordance with the present invention such the oblique end face 17 is designed to be different from the cleaved end face 16, and then it becomes possible to determine an orientation of such the oblique end face 17 as independently from that of the cleaved end face 16 because of forming by making use of the process of dry etching. Moreover, such the orientation of the oblique end face 17 in accordance with the present embodiment is designed to be performed a process of adjusting with making use of the bended waveguide 19. Further, a central angle of such the bended waveguide 19 is defined here to be as $\theta_b$, and then a direction of the linear waveguide 18 is designed to be changed with having such the angle as $\theta_b$. Still further, a radius of curvature of such the bended waveguide 19 is designed to be selected so as not to occur a rapid increase in loss due to the process of bending. Still further, such the radius of curvature of the bended waveguide 19 is assumed here to be as 300 μm due to the result that is obtained by examining in accordance with another experiment for a dependency of such the loss on the radius of curvature regarding the waveguide 12 of the high mesa type in accordance with the present embodiment.

Furthermore, it may be good for the angle of $\theta_b$ for bending the bended waveguide 19 to be designed as:

$$\theta_a + \theta_b = \theta_c,$$

in order to design the emitting beam 21 to be outgoing as vertical to the cleaved end face 16, and then in the case of the present embodiment it is determined that $$\theta_b = \theta_c - \theta_a = 23 - 7 = 15 \text{(degrees)}.$$

And thus in accordance with the first embodiment in which the above described configuration is comprised it becomes possible to obtain functions and advantages that will be described below.

It becomes possible to reduce the reflection factor at the end face by making use of such the oblique end face 17, and it becomes possible to design the direction of the emitting beam from such the oblique end face 17 (the emitting beam 21) as independently from that of the cleaved end face 16 as well.

It becomes possible to design for such the emitting beam 21 to be outgoing as vertical to the cleaved end face 16. And then thereby becoming unnecessary to devise such as that the semiconductor laser element 10 is required to be arranged at the sub mount by being inclined to be oblique beforehand or the like in accordance with the conventional technique for example that is mentioned above in a case where an emitting beam from a semiconductor optical device is designed to be coupled with such as an optical fiber or another waveguide or the like. Moreover, it is not necessary to make use of any special bonding equipment in order to perform such the arrangement of the semiconductor optical device on to the sub mount with inclining to be oblique as accurately so as to obtain the angle in accordance with the designing on the contrary to that in accordance with the conventional technique which is mentioned above. Further, it is not necessary to devise on the process of working either, such as that the marker for the angle is designed to be introduced into such the sub mount or the like. And then therefore it becomes easier to obtain the accuracy regarding the relative positioning of between the oblique end face 17 that is the emitting facet from the waveguide 12 in such the semiconductor laser element 10 and the end face on such the sub mount.

Here in accordance with such the semiconductor laser element 10 one side of the end faces (the end face at the left side in FIG. 1) on the waveguide 12 is designed to be as the cleaved end face, and then the reflection factor at such the end face is determined to be as approximately twenty-seven percent. In the meantime, the oblique end face 17 is designed to be made use for the end face at the opposite side (the end face at the right side in FIG. 1) on the waveguide 12. And then as a result by performing an estimation with making use of a threshold value and a ratio of an optical output from back and forth regarding a semiconductor laser in which each of the end faces on the waveguide 12 is designed to be as the cleaved end face respectively, it becomes possible to obtain the reflection factor of such the oblique end face 17 to be as approximately three percent even under a state where any of the coating film layer is not designed to be provided at all. And then it becomes possible to confirm that it becomes possible to reduce such the reflection factor to be as approximately one tenth as the reflection factor at the cleaved end face. Moreover, as a result by performing a measurement of a far field pattern in a direction as parallel to a surface of a wafer regarding the emitting beam 21, it becomes possible to confirm that the outgoing direction of such the emitting beam 21 is measured to be outgoing as vertical to the cleaved end face 16 in accordance with the designing. And then by making use of such the oblique end face 17 it becomes possible to confirm that it becomes possible to perform the decrease of the reflection as being compatible with performing a control of such the outgoing direction of the beam.

The Second Embodiment

Figure 4:
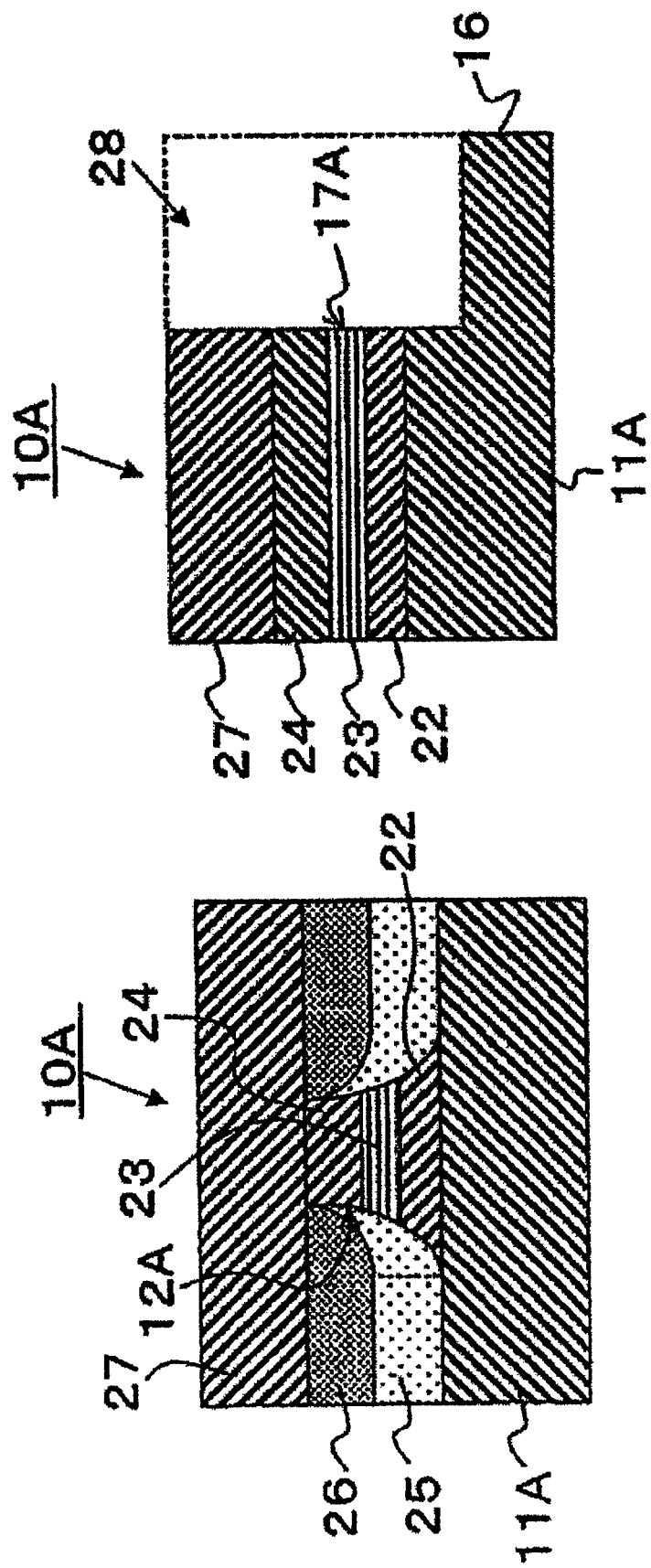
FIG. 4 (A) is a cross sectional view showing a schematic configuration of the semiconductor laser element that is shown in FIG. 3.

Next, an edge-emitting semiconductor laser element 10A that is designed to be as a semiconductor optical device in accordance with the second embodiment will be described in detail below, in reference to FIG. 3, FIG. 4 (A) and FIG. 4 (B). Here, FIG. 3 is a plan view for showing such the semiconductor laser element 10A; FIG. 4 (A) is a cross sectional view for showing a schematic configuration of such the semiconductor laser element 10A; and FIG. 4 (B) is a cross sectional view along a line of B-B' in a vicinity of an oblique end face on such the semiconductor laser element 10A that is shown in FIG. 3.

And then such the semiconductor laser element 10A comprises a substrate of an InP 11 and a waveguide 12A as an implantation type (the waveguide of an implanted mesa type) that comprises a mesa structure which is designed to be formed on to such the substrate of the InP 11, that are shown in FIG. 3 and in FIG. 4 (A). Here, it may be available to make use of a substrate of such as a GaAs or the like in place of such the substrate of the InP 11. Moreover, such the waveguide 12A further comprises a linear waveguide 18 and a bended waveguide 19 and a emitting waveguide 20 that are individually similar to each of which is provided in the waveguide 12 that is shown in FIG. 1 respectively, and then an end face on such the emitting waveguide 20 is designed to be as an oblique end face 17A.

And then at a time when such the semiconductor laser element 10A is performed a process of manufacturing, in the first instance, there are designed to be performed the following processes of forming an optical guiding layer 22 as an (n)

type; forming an active layer of the MQW-SCH 23; and then forming an optical guiding layer 24 as a (p) type, by growing one after the other in such the order on to a substrate of the InP as an (n) type 11A.

Next, the waveguide 12A is designed to be performed a process of forming to be as a mesa type by making use of a process of wet etching. And then such the waveguide 12A as the mesa type is designed to be comprised of the optical guiding layer 22 as the (n) type and the active layer of the MQW-SCH 23 and the optical guiding layer 24 as the (p) type.

Next, there are designed to be performed the following processes of forming an electrical current narrowing layer of a (p) type 25 and then forming an electrical current narrowing layer of an (n) type 26, by growing one after the other in such the order on to the substrate of the InP 11A. And then thereafter there are designed to be performed the following processes of forming an cladding layer at an upper side as a (p) type 27 that is formed of an InP and then forming a contact layer of an InGaAs as a (p) type that is omitted to be shown in any of the drawings, by growing one after the other in such the order on to the optical guiding layer 24 and on to such the electrical current narrowing layer of the (n) type 26 as well.

Next, the oblique end face 17A as an emitting facet from the waveguide 12A is designed to be performed a process of forming by making use of dry etching. And then there is designed to be performed a process of etching to be penetrated through the p-InP cladding layer at the upper side 27 and the optical guiding layer 24 and the active layer 23 and also through the optical guiding layer 22 till a depth reaching to a part at an upper side of the substrate of the InP 11A in accordance with such the process of dry etching, that are shown in FIG. 4 (B). And thus it becomes to prevent an emitting beam 21 that is to be outgoing from the oblique end face 17A on the waveguide 12A from scattering on the upper face of the substrate of the InP 11A that is etched, due to the process of etching as further deeply at a period of such the process of etching in order to form the oblique end face 17A (an end face etching) in such the manner. Moreover, a region for performing such the end face etching (an end face etching region) is designated by making use of a symbol of 28 in accordance with FIG. 3 and FIG. 4(B).

And thus in accordance with such the processes that are described above it becomes possible to form the waveguide 12A of the implanted mesa type that is shown in FIG. 3, FIG. 4 (A) and in FIG. 4 (B). Further, such the waveguide 12A becomes possible to comprise the oblique end face 17A that is designed to be as the end face which is different from the cleave end face 16 and that is designed to be inclined as oblique against such the cleave end face 16.

And then thereafter an electrode at a (p) side and an electrode at an (n) side are designed to be performed individual processes of forming on to a side of a top face and a side of a rear face of the substrate of the InP 11A respectively. Still further, such the substrate 11A is designed to be performed a process of cleaving. And then therefore it becomes possible to complete such the semiconductor laser element 10A.

And thus in accordance with the second embodiment in which the above described configuration is comprised it becomes possible to obtain the functions and the advantages that are individually similar to that in accordance with the first embodiment that is described above.

The Third Embodiment

Figure 5:
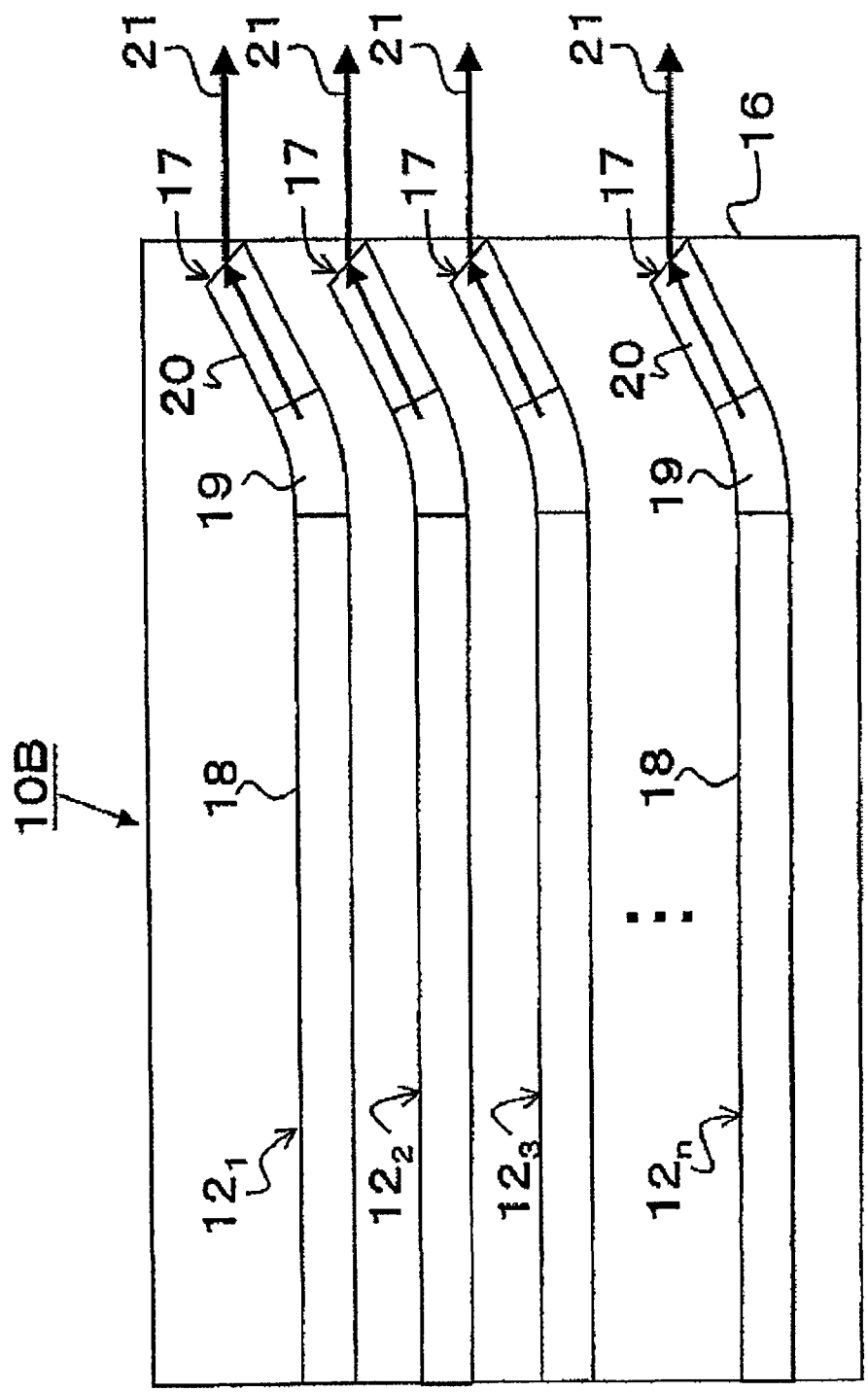
FIG. 5 is a plan view showing a schematic configuration of an array of semiconductor laser elements in accordance with the third embodiment.

FIG. 5 shows an array of semiconductor laser elements 10B as a semiconductor optical device in accordance with the third embodiment.

Here, such the array of the semiconductor laser elements 10B comprises a configuration in which a plurality (as the number of (n); (n) is a natural number as not smaller than one) of waveguides from $12_1$ to $12_n$ that are individually similar to the waveguide 12 in the edge-emitting semiconductor laser 10 in accordance with the above mentioned first embodiment that is shown in FIG. 1 are designed to be arranged in an array form on to the substrate of the InP 11.

And then in accordance with such the array of the semiconductor laser elements 10B an emitting beam 21 that is to be outgoing from an oblique end face 17 on each of emitting waveguides 20 in the individual (n) pieces of the waveguides from the $12_1$ to the $12_n$ is designed to be outgoing as vertical to the cleaved end face 16.

And thus in accordance with the third embodiment in which the above described configuration is comprised it becomes possible to obtain the following function and the advantage in addition to the functions and the advantages in accordance with the first embodiment that is described above.

It becomes possible to obtain a distance (gap) to be as uniformly for between the oblique end face 17 on each of the waveguides from the $12_1$ to the $12_n$ that are designed to be provided as the number of (n) pieces in the array form (each of the emitting facet) and the cleaved end face 16. And hence it is not necessary to make use of any special optical part nor component nor any additional process of working in order to maintain such the above mentioned gap to be as uniformly in accordance with the conventional technique for example that is mentioned above in a case where such the oblique end face 17 on each of such the waveguides from the $12_1$ to the $12_n$ in the array of the semiconductor laser elements 10B is designed to be coupled with such as the array of the optical fibers or a plurality of the optical guided wave paths in the planer lightwave circuit or the like.

The Fourth Embodiment

Next, a semiconductor laser element 10C that is designed to be as a semiconductor optical device in accordance with the fourth embodiment will be described in detail below, in reference to FIG. 6.

Here in accordance with such the semiconductor laser element 10C spot-size converter 30 is designed to be integrated at an emitting part from the edge-emitting semiconductor laser 10 in accordance with the above mentioned first embodiment that is shown in FIG. 1. And in the meantime, all the other configurations are individually similar to each of the individual corresponding parts in such the edge-emitting semiconductor laser element 10 in accordance with the first embodiment.

Figure 6:
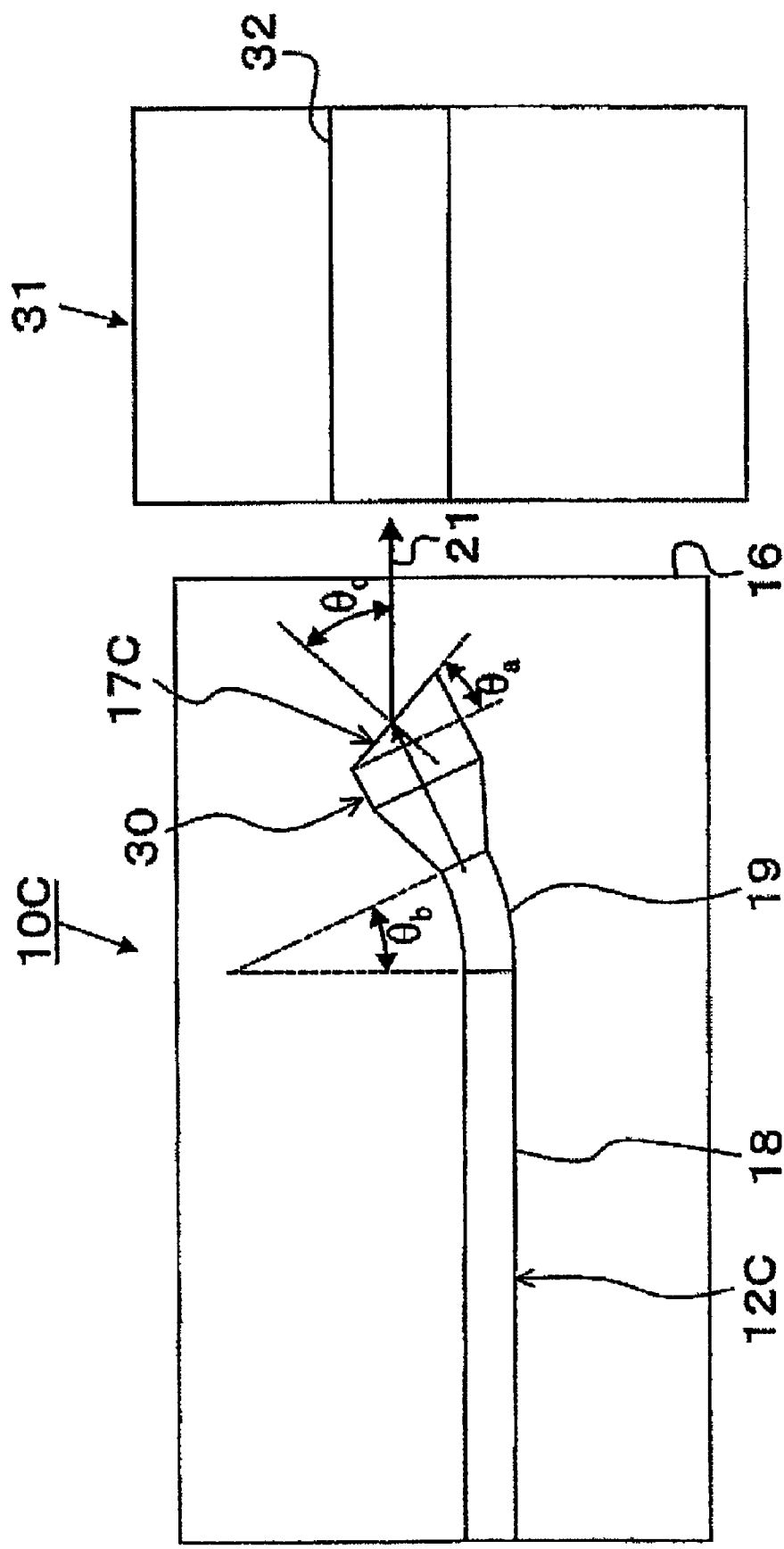
FIG. 6 is a plan view showing an arrangement of a semiconductor laser element and a planer lightwave circuit (PLC) in accordance with the fourth embodiment.

Moreover, such the semiconductor laser element 10C is designed to be formed with taking into consideration of coupling an emitting beam 21 which is to be outgoing from an oblique end face 17C that is designed to be as an emitting facet from a waveguide 12C with an optical waveguide 32 in a chip of the PLC 31 of a quartz system to each other in which a planer lightwave circuit (PLC) including the optical waveguide 32 is designed to be formed, that is shown in FIG. 6. Further, into a gap between such the semiconductor laser element 10C and the optical waveguide 32 in such the chip of the PLC 31 index matching oil is assumed to fill up with corresponding to such the optical waveguide 32.

And then some aspects in accordance with such the semiconductor laser element 10C can be found out in the configuration in which the spot-size converter 30 is designed to be integrated in a direction as horizontal to the emitting part from the semiconductor laser element 10 in order to improve an efficiency of coupling with the optical waveguide 32, and then the emitting facet on each of such the spot-size converter 30 is designed to be as the oblique end face 17C as well. Here it is assumed that an angle as $\theta_a$ regarding such the oblique end face 17C is equal to seven degrees that is similar to that in the edge-emitting semiconductor laser element 10 in accordance with the first embodiment that is described above. In the meantime, however, the index of refraction as the $n_a$ for the external ambient atmosphere is assumed here to be as 1.4 that is an index of refraction due to an index matching oil. And then by making use of the equation (1) it becomes possible to obtain that the $\theta_c$ is nearly equal to sixteen degrees. And hence in the case of the present embodiment it is determined that $$\theta_b = \theta_c - \theta_a = 16 - 7 = 9 \text{(degrees)}.$$

There are some types of method for converting a spot size, and here in accordance with the present embodiment the spot-size converter 30 is designed to be made use that is a type by which a width of the mesa of the waveguide 12C becomes to be widened gradually with making use of a shape of a reversed taper. And then by making use of such the spot-size converter 30 the spot size in a horizontal direction is designed to be enlarged. Moreover, the chip of the PLC 31 is designed with having a difference (Δ) of the indexes of refraction of between a core layer and a cladding layer to be as 1.5% and with having a width and a thickness of such the core layer to be as approximately five micrometers respectively. Further, regarding a width of such the shape of the reversed taper the spot size after performing the enlargement is designed to be matched with the spot size of the optical waveguide 32 after performing refraction on the oblique end face. Still further, the width of the mesa at a part that has the shape of the reversed taper is designed to be widened from two micrometers to seven micrometers. Furthermore, a length of such the part that has the shape of the reversed taper is designed to be as 200 μm so as not to excite any mode of higher order but to become widespread a fundamental mode as gradually.

Here, a process of manufacturing such the semiconductor laser element 10C is nearly similar to that in accordance with the first embodiment, however, regarding the bended waveguide 19 and the spot-size converter 30 a layer of an InGaAsP as transparent is designed to be formed by making use of a technology of a butt joint growth respectively, in place of the active layer 14 that is shown in FIG. 2 (A), and then such the layer is designed to function as a transparent core of a waveguide.

Moreover, the spot size in the horizontal direction regarding such the semiconductor laser element 10C that is performed the process of manufacturing is nearly similar to the spot size of the optical waveguide 32 in the chip of the PLC 31. Further, it becomes possible to confirm that the emitting beam 21 becomes to be outgoing as vertical to the cleaved end face 16. Still further, a loss of the coupling between such the semiconductor laser element 10C and such the optical waveguide 32 in the chip of the PLC 31 is evaluated to be as approximately 3.5 dB.

Still further, the index matching oil is designed to be made use for the gap between such the semiconductor laser element 10C and such the chip of the PLC 31, and then a method of sensing by contact is designed to be applied in order to perform a control of such the gap. And hence it becomes possible to perform the control of such the gap between such the semiconductor laser element 10C and such the chip of the PLC 31 to be as approximately five micrometers. And then as a result, it becomes possible to obtain the oblique end face 17C on the waveguide 12C without having any damage at all in the period of such the process of controlling such the gap.

Still further, a value that is obtained by an experiment becomes to be extremely well matched with a calculation as the loss of coupling in accordance with the calculation is evaluated to be as approximately 3.2 dB. Still further, it is found out that almost all amount of such the loss of coupling is due to a mismatch of the spot sizes in the vertical direction. And therefore it is possible to reduce further such the loss of coupling as well by performing together a converting of the spot size in such the vertical direction. Furthermore, it becomes possible to perform the enlargement of such the spot size in the vertical direction by performing a process of thinning a layer thickness of the core layer at the part of the reversed taper to be thinner as close to the oblique end face 17C that is designed to be as the emitting facet, by making use of such as a technique of a selective growth or the like.

And thus in accordance with the fourth embodiment in which the above described configuration is comprised it becomes possible to obtain the following functions and the advantages in addition to the functions and the advantages in accordance with the first embodiment that is described above.

The spot-size converter 30 for the horizontal direction is designed to be integrated at the emitting part in such the semiconductor laser element 10C, and then the emitting facet on each of such the spot-size converter 30 is designed to be as the oblique end face 17C as well. And then therefore it becomes possible to improve the efficiency of coupling for between the emitting beam 21 that is to be outgoing from such the oblique end face 17C on the semiconductor laser element 10C and the optical waveguide 32.

In accordance with such the spot-size converter 30 the spot size of the emitting beam 21 after performing the enlargement by making use of such the transducer is designed to be matched with the spot size of the optical waveguide 32 after performing the refraction on the oblique end face 17C. And then therefore it becomes possible to improve further the efficiency of coupling for between the emitting beam 21 that is to be outgoing from such the oblique end face 17C on the semiconductor laser element 10C and the optical waveguide 32.

An accuracy becomes to be extremely loosened that is required for performing a fine processing in a period of such as a process of patterning or a process of dry etching or the like, because the oblique end face 17C is designed to be formed on to the emitting facet from the spot-size converter 30 after performing the process of enlarging the width of the mesa of the waveguide 12.

Here in general the method of sensing by contact regarding the control of the gap is designed to be made use for performing the control of the gap between such as the optical fiber and the PLC waveguide of the quartz system and the like, by which each of such the waveguides is matched face to face with another and is contacted to the other, and then thereafter the same is coupled with each other under a state of being separated with having an amount of the gap to be required. However, a semiconductor normally has a material strength to be as brittle comparing to that of such as an optical fiber or a PLC waveguide or the like. And then in accordance with the conventional semiconductor optical device in which the cleaved end face is designed to be made use for the incident facet and for emitting facet, there is existing a problem that it is not possible to apply such the method of sensing by contact because such for the incident facet and for the emitting facet become to have a damage due to such the process of sensing by contact.

In the meantime, however, the oblique end face 17C on such the semiconductor laser element 10C is designed to be the face as different from the cleaved end face 16, and then the same is apart with a small amount from such the cleaved end face 16. And therefore it becomes possible to make use of such the method of sensing by contact that is mentioned above in a period of performing the process of coupling the emitting beam 21 that is to be outgoing from such the oblique end face 17C with such as the optical waveguide 32 in the chip of the PLC 31 or the like.

The Fifth Embodiment

Next, an array of semiconductor optical amplifiers 10D that is designed to be as a semiconductor optical device in accordance with the fifth embodiment will be described in detail below, in reference to FIG. 7.

Here, such the array of the semiconductor optical amplifiers 10D comprises a configuration in which a plurality (as the number of (n); (n) is a natural number as not smaller than one) of semiconductor optical amplifiers (SOAs) from $40_1$ to $40_n$ are designed to be arranged in an array form on to a substrate of a semiconductor. Moreover, at a part for incoming into a waveguide 12D in each of such the semiconductor optical amplifiers from the $40_1$ to the $40_n$ there are designed to be integrated spot-size converters 41, and then an end face for incoming into each of such the spot-size converters 41 is designed to be as an oblique end face 41a. Further, there are designed to be integrated another group of spot-size converters 42 as well at an emitting part from each of the waveguides 12D, and then an emitting facet from each of such the spot-size converters 42 is designed to be as an oblique end face 42a that is similar to the oblique end face 17C on the spot-size converter 30 that is shown in FIG. 6.

Figure 7:
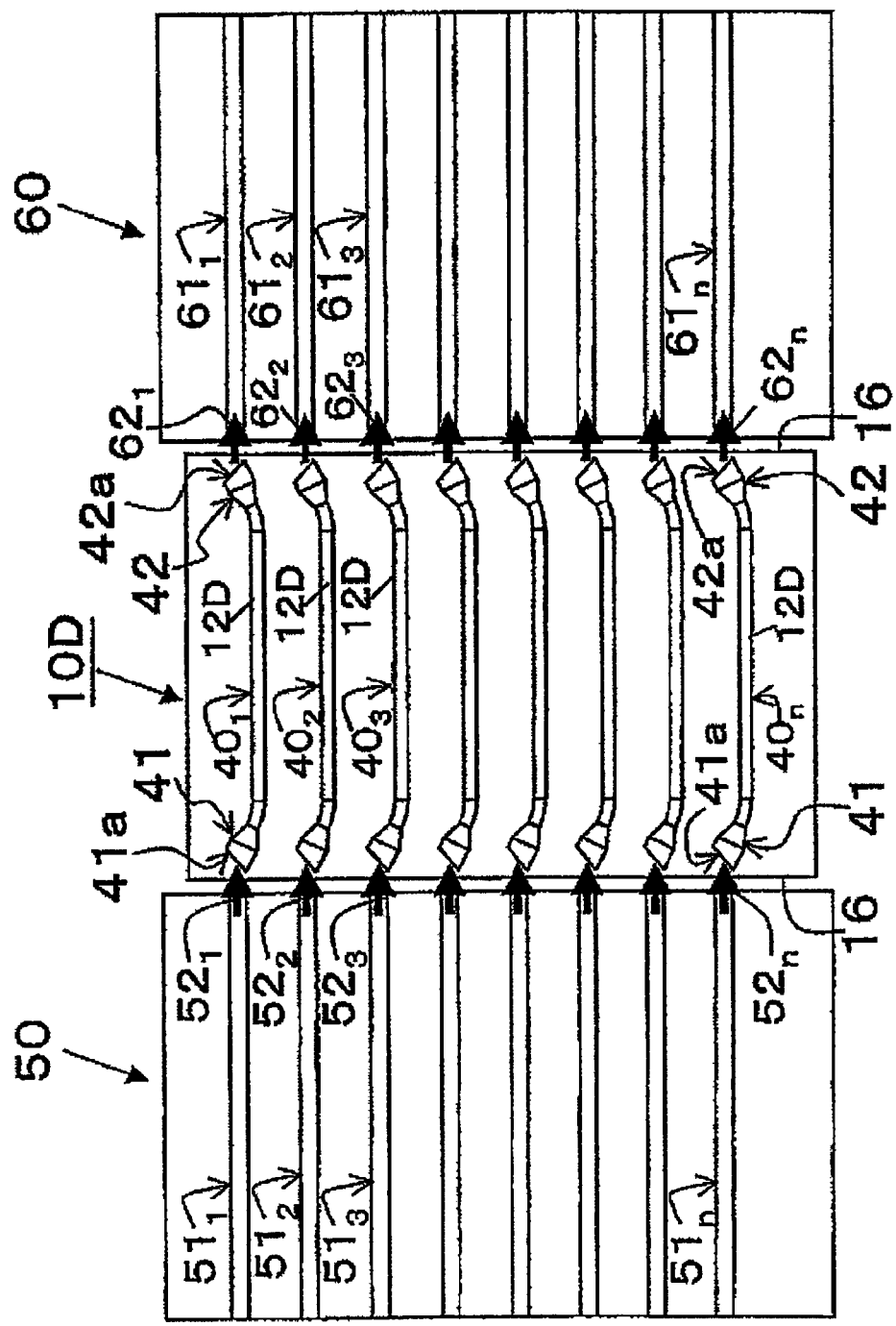
FIG. 7 is a plan view showing an arrangement of an array of semiconductor optical amplifiers and two pieces of chips of PLC in accordance with the fifth embodiment.

Still further, such the array of the semiconductor optical amplifiers 10D is designed to be formed with taking into consideration of coupling each of incident beams from $52_1$ to $52_n$ which is to be incoming into each of corresponding optical guided wave paths from $51_1$ to $51_n$ in a chip of the PLC 50 of a quartz system, in which a planer lightwave circuit including such the individual optical guided wave paths from the $52_1$ to the $52_n$ as a plurality of the number of (n) ((n) is a natural number as not smaller than one) is designed to be formed, to each other with the oblique end face 41a that is designed to be as the incident facet on each of such the waved guides 12D, that is shown in FIG. 7. Still further, such the array of the semiconductor optical amplifiers 10D is designed to be formed with further taking into consideration of coupling each of emitting beam from $62_1$ to $62_n$ which is to be outgoing from the oblique end face 42a that is designed to be as the emitting facet on each of such the waved guides 12D to each other with optical guided wave paths from $61_1$ to $61_n$ in a chip of the PLC 60 of a quartz system, in which a planer lightwave circuit (PLC) including such the individual optical guided wave paths from the $61_1$ to the $61_n$ as a plurality of the number of (n) is designed to be formed.

Furthermore, into a gap between such the chip of the PLC 50 and such the array of the semiconductor optical amplifiers 10D, and into a gap between such the array of the semiconductor optical amplifiers 10D and such the chip of the PLC 60 an index matching oil is assumed to fill up with corresponding to each of such the optical guided wave paths from the $52_1$ to the $52_n$ and from the $62_1$ to the $62_n$ respectively.

And thus in accordance with the fifth embodiment in which the above described configuration is comprised it becomes possible to obtain the following functions and the advantages in addition to the functions and the advantages in accordance with the first embodiment that is described above.

It becomes possible to improve the efficiency of coupling for between each of the incident beams from the $52_1$ to the $52_n$ that is to be incoming into such the oblique end face 41a on each of the waved guides 12D and each of the corresponding optical guided wave paths from the $51_1$ to the $51_n$ in the chip of the PLC 50 in accordance with such the array of the semiconductor optical amplifiers 10D. Moreover, it becomes possible to improve the efficiency of coupling for between the emitting beam from the $62_1$ to the $62_n$ that is to be outgoing from such the oblique end face 42a on each of the waved guides 12D and the optical guided wave paths from the $61_1$ to the $61_n$ in the chip of the PLC 60.

Each of such the oblique end faces 41a and the 42a on each of such the waved guides 12D in such the array of the semiconductor optical amplifiers 10D is designed to be the face as different from the cleaved end face 16 respectively, and then the same is apart as a small amount from such the cleaved end face 16. And then therefore it becomes possible to make use of such the method of sensing by contact that is mentioned above in a period of performing the process of coupling the incident beam into such the oblique end face 41a with the chip of the PLC 50 and the process of coupling the emitting beam 21 that is to be outgoing from such the oblique end face 42a with the chip of the PLC 60, respectively.

(Forming a Reflection Free Coating Film Layer)

As described above, such the array of the semiconductor laser elements 10D that is mentioned in reference to FIG. 5 comprises the configuration in which a plurality (as the number of (n)) of waveguides from $12_1$ to $12_n$ as the high mesa type are designed to be arranged in an array form on to the substrate of the InP 11 that is similar to the waveguide 12 in the semiconductor laser element 10 which is shown in FIG. 1 and in FIG. 2 (A) and (B).

Moreover, it may be available to design each of such the waveguides from $12_1$ to $12_n$ in the array of the semiconductor laser elements 10B to be as a waveguide of an implanted mesa type as well that is similar to the waveguide 12A in the semiconductor laser elements 10A which is shown in FIG. 3 and in FIG. 4 (A) and (B).

And then in accordance with such the array of the semiconductor laser elements 10B that is shown in FIG. 5 an oblique end face on each of the waveguides becomes to be exposed to an outer side at a position that is apart with a small amount from the cleaved end face 16 even in a case where each of such the waveguides from the $12_1$ to the $12_n$ is designed to be as either one of a waveguide of the high mesa type or a waveguide of the implanted type. That is to say, such the oblique end face on each of the waveguides becomes to be exposed to the outer side at the position that is apart with the small amount from the cleaved end face 16 after performing a wafer process for such the array of the semiconductor laser elements 10B in which the waveguide of the high mesa type is designed to be provided as a plurality thereof that is shown in FIG. 2 (A) and (B). Further, such the oblique end face on each of the waveguides becomes to be exposed to the outer side at the position that is apart with the small amount from the cleaved end face 16 as similar thereto after performing another wafer process for such the array of the semiconductor laser elements 10B in which the waveguide of the implanted type is designed to be provided as a plurality thereof that is shown in FIG. 4 (A) and (B).

And then it becomes possible to make use of a process that will be described in detail below by making use of such the above described aspects in order to form a reflection free coating film layer on to the end face on each of the waveguides, such as the oblique end face or the like.

Here such a process of forming the reflection free coating film layer will be described in detail below in reference to FIG. 8.

Figure 8:
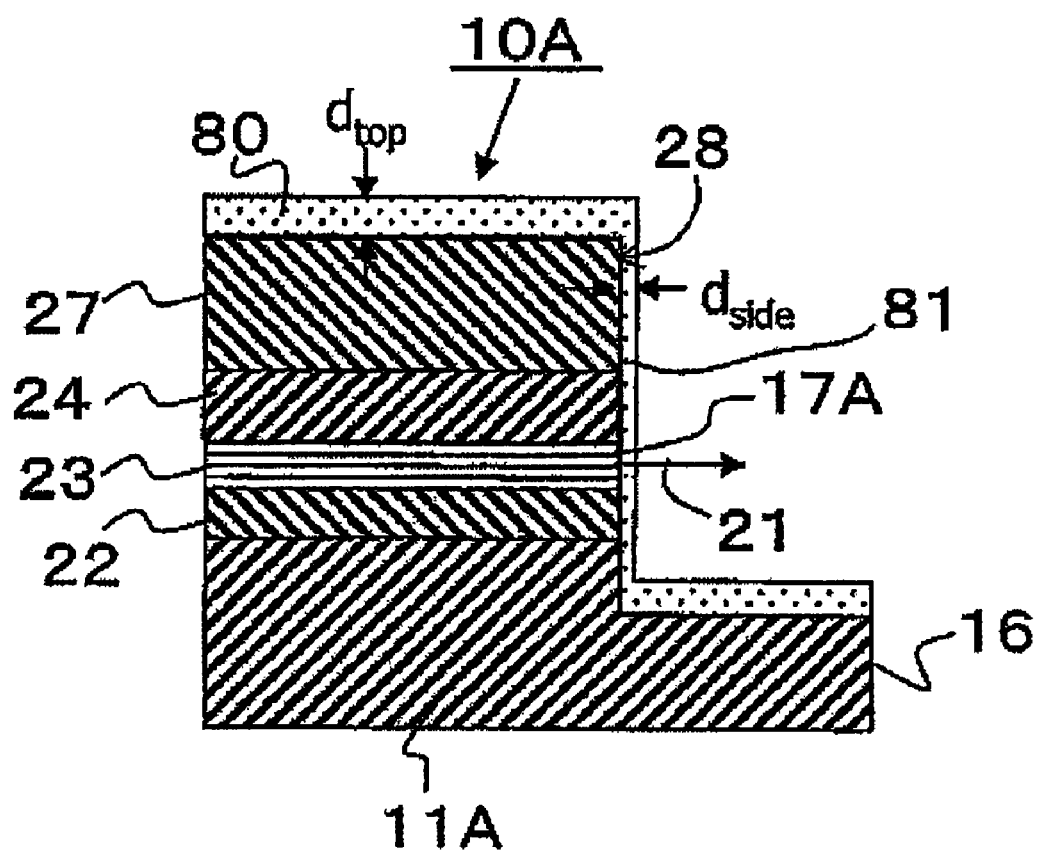
FIG. 8 is a cross sectional view showing a vicinity of an end face on a semiconductor laser element that is made use for explaining a process of forming a reflection free coating film layer on an end face of a waveguide by making use of a wafer process.
Figure 9A:
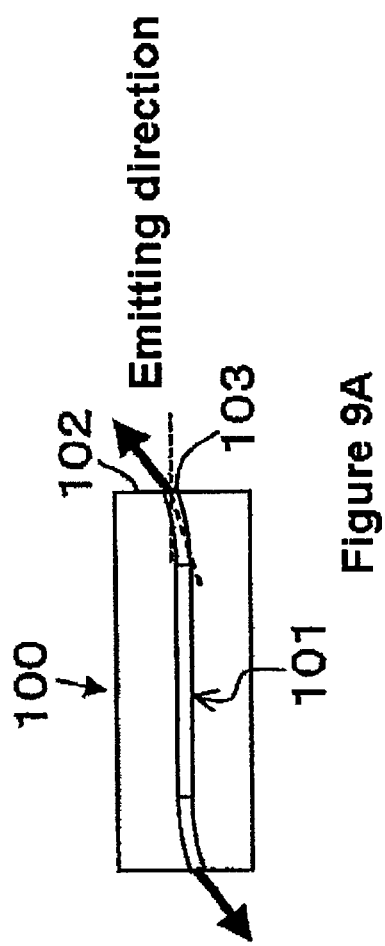
FIG. 9 (A) to (C) are explanatory drawings in order to explain a conventional technique.
Figure 9C:
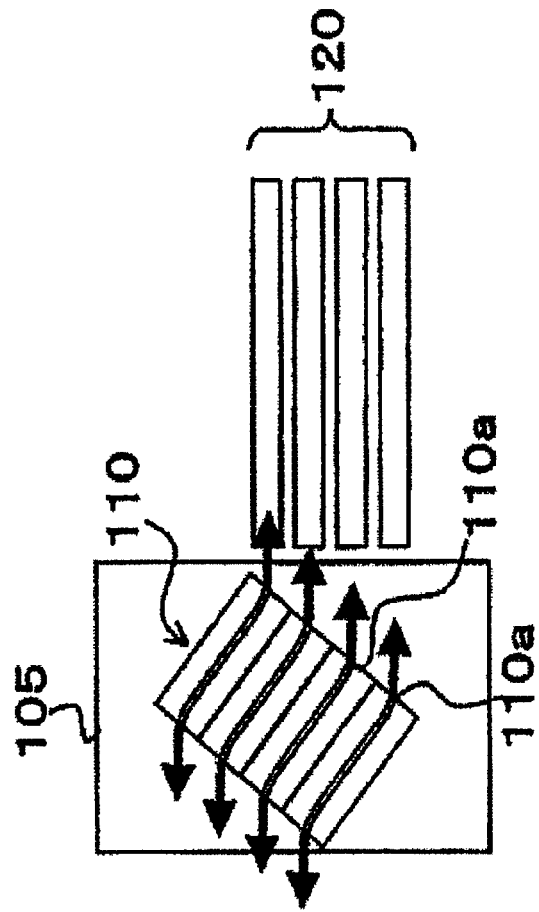
Figure 9B:
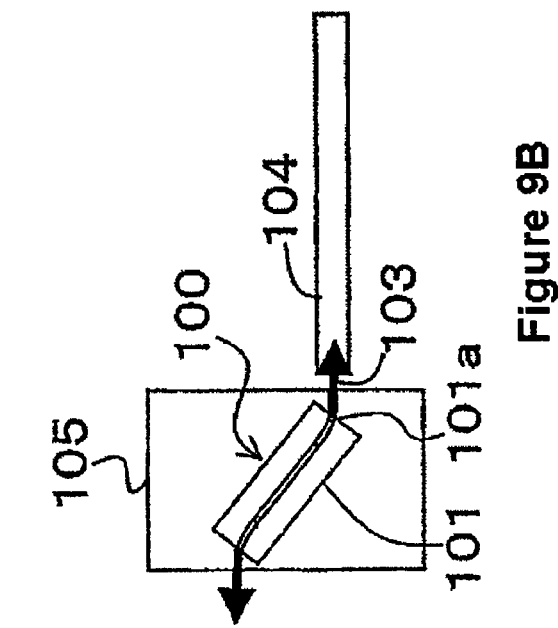

FIG. 8 is a cross sectional view for showing a part at an end face on a semiconductor laser element that comprises a waveguide of an implanted type (waveguide of an implanted mesa type) which is similar to that in accordance with the semiconductor laser element 10A which is described with making use of FIG. 3 and FIG. 4 (A) and (B).

Here some devices are designed to be provided that will be described in detail below regarding a process of forming a passivation film layer of an $SiN_x$ after performing a process of etching the mesa and then performing a process of etching the end face.

In accordance with FIG. 8 there is shown a cross sectional view in a vicinity of an end face that is to be performed a process of dry etching, that is the cross sectional view as similar to that in accordance with FIG. 4 (B). And then in a case of performing a process of accumulating in order to form the mesa that has such a shape by making use of the equipment for processing the PCVD, not only on to an upper part of such the mesa but also at a side wall part of the mesa a film layer is designed to be formed. Here a rate of accumulating between a film layer 80 that is designed to be formed on to such the upper part of the mesa and a film layer 81 that is designed to be formed on to such the side wall part of the mesa becomes to have a certain ratio in general. And hence it becomes possible to perform a control regarding a layer thickness $d_{side}$ of the film layer 81 on such the side wall part of the mesa to be as a desired value if such the ratio is known beforehand. Moreover, there is a case where it is possible to control an index of refraction of a film layer within a certain range for such as a film layer of the $SiN_x$ or the like by changing a ratio of flow rates of raw material gases, such as a silane and ammonia and the like. And then by making use of such the properties it becomes possible to form a reflection free coating film layer on to the oblique end face 17A by performing the controls of the layer thickness and the index of refraction of the passivation film layer 81 that is designed to be accumulated at the side wall part of such the oblique end face 17A. Further, a condition of such the accumulation is designed to be controlled in order to obtain the index of refraction of the film layer of the $SiN_x$ to be as approximately 2.11 with taking into consideration of making use of the index matching oil that has the index of refraction as 1.4 approximately and in order to obtain the layer thickness of the side wall part to be as approximately 184 nm as well. Furthermore, it may be available to design for the index of refraction of the film layer to be as approximately 1.78 and for the layer thickness of such the layer to be as approximately 217 nm in order to form a reflection free coating film layer without making use of any index matching oil at all and then just with corresponding to the air that has the index of refraction as one.

Here it is common regarding a coating for an end face on an ordinary device in which a cleaved end face is designed to be as for an incident facet thereinto and for an emitting facet therefrom that after performing the wafer process such a wafer is designed to be performed a process of cleaving into a shape of a bar and then that a coating film layer is designed to be performed a process of accumulating on to the cleaved end face that becomes to be exposed due to such the processes beforehand. And then in such the case thereof it is required to perform the process of coating for the end face regarding each of the bars as the large number thereof that are divided from the wafer. And hence it becomes to be a process for which an excessively large amount of man hours are required. In the meantime, however, in accordance with the present embodiment it becomes possible to reduce as extremely such the man hours which are required for performing such the process of coating, because it becomes possible to perform the process of forming the incident facet thereinto and for emitting facet therefrom with making use of the wafer process by making use of the process of dry etching, and because it becomes possible to perform the process of coating for such the end face in such the form of the wafer as well. And then therefore it becomes possible to reduce a cost for manufacturing such the device.

Moreover, it is possible to embody the present invention as well by performing a modification in the manner that will be described in detail below.

The edge-emitting semiconductor laser element 10 in accordance with the first embodiment that is shown in FIG. 1 is designed to comprise the configuration in which the waveguide 12 is designed to comprise the linear waveguide 18 and the bended waveguide 19 and the emitting waveguide 20 as well. However, the scope for applications in accordance with the present invention will not be limited to such the configuration at all. And then it may be available to design for a tip of such the bended waveguide 19 to be as an oblique end face as well without designing to be provided any of such the emitting waveguide 20 at all for example. Or, it may be also available to design for such the linear waveguide 18 not to be as vertical to the cleaved end face 16 either.

Further, in accordance with the first embodiment the angle of the bended waveguide 19 is designed and then performed the process for manufacturing in order to face the emitting beam 21 to the direction as vertical to the cleaved end face 16. However, it may be possible to design for such the emitting beam 21 as intentionally with depending on a usage so as to be outgoing with having a certain angle against such the direction as vertical to the cleaved end face 16 as well.

Still further, in accordance with the first embodiment the structure of the waveguide regarding the waveguide 12 is designed to be as the waveguide of the high mesa type. However, it may be available to design as well such the waveguide to be as a low mesa type in place of such the waveguide 12 as the high mesa type. Here in general the smaller the difference of the indexes of refraction of between the core layer and the cladding layer in a lateral direction of the waveguide, the larger the effect for reducing the reflection factor at an end face becomes to be in the case where the end face on the waveguide 12 is designed to be as the oblique end face 17. And then therefore it becomes possible to reduce as extremely the reflection factor at the end face by making use of the oblique end face 17 in accordance with such as the waveguide of the low mesa type or the waveguide of the implanted mesa type or the like.

Still further, in a case where the present invention is applied to a semiconductor optical device of a waveguide type an oblique end face is designed to be formed at an incident facet on such the waveguide, that is similar to the oblique end face 17 on the semiconductor laser element 10 in accordance with the first embodiment that is shown in FIG. 1.

Furthermore, it is possible to apply the present invention to an array of semiconductor waveguide devices as well in place of the array of the semiconductor optical amplifiers, though there is described regarding such the array of the semiconductor optical amplifiers as one example of the array of the semiconductor waveguide devices in accordance with the fifth embodiment. For example, it is possible to apply the present invention as well to such as an array of semiconductor optical amplifiers in which waveguides are designed to be provided as a plurality thereof on to a substrate of a semiconductor and an array of modulators as the electro-absorption type and an array of modulators as the Mach-Zehnder type and the like.

The present invention is not limited to the above described embodiments and various and modifications may be possible without departing from the scope of the present invention.

What is claimed is:

1. A semiconductor optical device comprising:
a semiconductor substrate including cleaved facets on respective sides, the cleaved facets being perpendicular to a longitudinal direction of the device; and
a waveguide formed on the semiconductor substrate, the waveguide including
a linear waveguide portion formed along the longitudinal direction,
a bended waveguide portion and an ending waveguide portion formed on at least one side of the semiconductor optical device, the ending waveguide portion being connected to the linear waveguide portion via the bended waveguide portion, and
an angled facet formed on an end of the ending waveguide portion opposite to the bended waveguide portion, the angled facet making a first angle with the longitudinal direction and a second angle with the cleaved facets in a width direction of the semiconductor optical device, wherein
a light is input or output to or from the angled facet in the longitudinal direction, and
an optical axis of the light input or output to or from the angled facet is parallelly-shifted from the linear waveguide portion by a predetermined distance.

2. The semiconductor optical device according to claim 1, wherein the semiconductor optical device is a semiconductor laser element configured to emit a laser light from the angled facet.

3. The semiconductor optical device according to claim 2, further comprising a plurality of waveguides of a same type as the waveguide formed in an array on the semiconductor substrate.

4. The semiconductor optical device according to claim 2, wherein the ending waveguide portion includes a spot-size converter.

5. The semiconductor optical device according to claim 1, wherein the semiconductor optical device is a waveguide-type photo detector.

6. The semiconductor optical device according to claim 5, further comprising a plurality of waveguide-type photo detectors of a same type as the waveguide-type photo detector formed in an array on the semiconductor substrate.

7. The semiconductor optical device according to claim 5, wherein the ending waveguide portion includes a spot-size converter.

8. The semiconductor optical device according to claim 1, wherein the semiconductor optical device is a semiconductor waveguide device that exerts an optical effect or an electro-optical effect as desired to an input light.

9. The semiconductor optical device according to claim 8, further comprising a plurality of semiconductor waveguide devices of a same type as the semiconductor waveguide device formed in an array on the semiconductor substrate.

10. The semiconductor optical device according to claim 8, wherein the ending waveguide portion includes a spot-size converter.

11. An optical module comprising:
a semiconductor optical device including
a semiconductor substrate including cleaved facets on respective sides, the cleaved facets being perpendicular to a longitudinal direction of the device, and
a waveguide formed on the semiconductor substrate, the waveguide including
a linear waveguide portion formed along the longitudinal directions,
a bended waveguide portion and an ending waveguide portion formed on at least one side of the semiconductor optical device, and
an angled facet formed on an end of the ending waveguide portion, making a predetermined angle with the longitudinal direction and a predetermined angle with the cleaved facets in a width direction of the semiconductor optical device; and
an optical fiber optically coupled to the semiconductor optical device, wherein
the ending waveguide portion is connected to the linear waveguide portion via the bended waveguide portion, and
a light is input or output to or from the angled facet along the longitudinal direction, and
an optical axis of the light input or output to or from the angled facet is shifted from the linear waveguide portion in a parallel manner by a predetermined amount.

12. An optical module comprising:
a semiconductor optical device including
a semiconductor substrate including cleaved facets on respective sides, the cleaved facets being perpendicular to a longitudinal direction of the device, and
a waveguide formed on the semiconductor substrate, the waveguide including
a linear waveguide portion formed along the longitudinal direction,
a bended waveguide portion and an ending waveguide portion formed on at lest one side of the semiconductor optical device, and
an angled facet formed on an end of the ending waveguide portion, making a predetermined angle with the longitudinal direction and a predetermined angle with the cleaved facets in a width direction of the semiconductor optical device; and
a planar lightwave circuit optically coupled to the semiconductor optical device, wherein
the ending waveguide portion is connected to the linear waveguide portion via the bended waveguide portion, and
a light is input or output to or from the angled facet along the longitudinal direction, and
an optical axis of the light input or output to or from the angled facet is shifted from the linear waveguide portion in a parallel manner by a predetermined amount.

13. The semiconductor optical device according to claim 1, wherein the optical axis of the light input or output to or from the angled facet is changed at the angled facet by a refractive index difference between the ending waveguide portion and an ambient medium.

14. The semiconductor optical device according to claim 1, wherein the waveguide is a high mesa-type waveguide including a core layer and cladding layers sandwiching the core layer.

* * * * *